United States Patent
Spaggiari et al.

(10) Patent No.: US 10,671,111 B1
(45) Date of Patent: Jun. 2, 2020

(54) SUPPLY VOLTAGE APPARATUS WITH INTEGRATED GAIN ADJUSTMENT AND MULTIPLE SUPPLY MONITORING

(71) Applicant: Analog Devices International Unlimited Company, Limerick (IE)

(72) Inventors: Michele Spaggiari, Valencia (ES); Miguel A. Ruiz, Riba-Roja de Turia (ES); Jose Tejada, Valencia (ES)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/224,407

(22) Filed: Dec. 18, 2018

(51) Int. Cl.
*G06F 1/04* (2006.01)
*H02M 1/00* (2006.01)
*G01R 19/165* (2006.01)
*H02M 3/07* (2006.01)

(52) U.S. Cl.
CPC ......... *G06F 1/04* (2013.01); *G01R 19/16552* (2013.01); *H02M 1/00* (2013.01); *H02M 3/07* (2013.01); *H02M 2001/0032* (2013.01)

(58) Field of Classification Search
CPC ...... G06F 1/04; G01R 19/16552; H02M 1/00; H02M 3/07; H02M 2001/0032
See application file for complete search history.

(56) References Cited

U.S. PATENT DOCUMENTS

| | | |
|---|---|---|
| 5,021,679 A | 6/1991 | Fairbanks et al. |
| 5,166,887 A | 11/1992 | Farrington et al. |
| 5,648,759 A | 7/1997 | Miller et al. |
| 5,727,221 A | 3/1998 | Walsh et al. |
| 5,754,036 A | 5/1998 | Walker |
| 5,754,436 A | 5/1998 | Walsh et al. |
| 5,771,373 A | 6/1998 | Kau et al. |
| 5,903,138 A | 5/1999 | Hwang et al. |
| 6,563,746 B2 | 5/2003 | Fujioka et al. |
| 6,643,151 B1 | 11/2003 | Nebrigic et al. |
| 6,717,374 B2 | 4/2004 | Krummel |
| 7,639,067 B1 | 12/2009 | Perisetty |
| 7,873,854 B2 | 1/2011 | Westwick et al. |
| 8,022,680 B2 | 9/2011 | Ryoo |
| 8,542,059 B2 | 9/2013 | Tejada et al. |
| 2009/0085685 A1 | 4/2009 | Guo et al. |
| 2009/0089599 A1 | 4/2009 | Westwick et al. |
| 2009/0160422 A1* | 6/2009 | Isobe ............... H02M 3/156 323/349 |
| 2013/0294118 A1 | 11/2013 | So et al. |
| 2016/0018873 A1 | 1/2016 | Fernald et al. |

* cited by examiner

*Primary Examiner* — John W Poos
(74) *Attorney, Agent, or Firm* — Schwegman Lundberg & Woessner, P.A.

(57) ABSTRACT

A power management unit comprises a controller, an oscillator circuit, and a monitoring circuit. The controller is configured to control operation of a power converter circuit in a low power mode and an active mode. The oscillator circuit is configured to generate clock signals in the low power mode to control the operation of the power converter circuit. The monitoring is circuit configured when in the low power mode to receive a regulated output voltage from the power converter circuit, compare the regulated output voltage to a specified voltage threshold, and turn off the oscillator circuit when the regulated output voltage is greater than the specified threshold voltage and turn on the oscillator circuit when the regulated output voltage is less than the specified threshold voltage.

22 Claims, 12 Drawing Sheets

SUPPLY VOLTAGE APPARATUS WITH INTEGRATED GAIN ADJUSTMENT AND MULTIPLE SUPPLY MONITORING

FIELD OF THE DISCLOSURE

This document relates to electronic circuits, and in particular it relates to electronic circuits for managing power in electronic systems.

BACKGROUND

Electronic systems can include devices that require a regulated power source. Power converter circuits can be used to provide a circuit supply rail having a regulated voltage. As electronic systems continue to evolve they require more complexity in a smaller size. A power management unit refers to a portion of the electronic system that manages the circuit supply rails of an electronic system. Some electronic systems seek to reduce the power required during the time when the system is idle. However, some circuit functionality is still required even when the electronic system is idle. The present inventors have recognized a need for improved performance of power converter circuits.

SUMMARY OF THE DISCLOSURE

This document relates generally to power management circuits and methods of their operation. In some aspects, a power management unit comprises a controller, an oscillator circuit, and a monitoring circuit. The controller is configured to control operation of a power converter circuit in a low power mode and an active mode. The oscillator circuit is configured to generate clock signals in the low power mode to control the operation of the power converter circuit. The monitoring is circuit configured when in the low power mode to receive a regulated output voltage from the power converter circuit, compare the regulated output voltage to a specified voltage threshold, and turn off the oscillator circuit when the regulated output voltage is greater than the specified threshold voltage and turn on the oscillator circuit when the regulated output voltage is less than the specified threshold voltage.

In some aspects, a method of operating a power management unit of an electronic system includes monitoring, during a low power mode, a regulated output voltage of a power converter circuit operatively coupled to the power management unit, disabling all clock signals of the power management unit and the power converter circuit during the low power mode when the regulated output voltage is greater than a specified threshold voltage, and enabling the clock signals of the power management unit and the power converter circuit during the low power mode when the regulated output voltage is less than the specified threshold voltage.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Electronic systems may implement a low power mode to reduce power consumption. In a low power mode, some circuits of the electronic system are disabled to conserve the energy consumed by their operation. For some battery powered electronic systems it may be desired to implement an ultra-low power mode. In an ultra-low power mode, a significant portion of the electronic system spends above 99.9% of its time in the low power mode.

Figure 1:
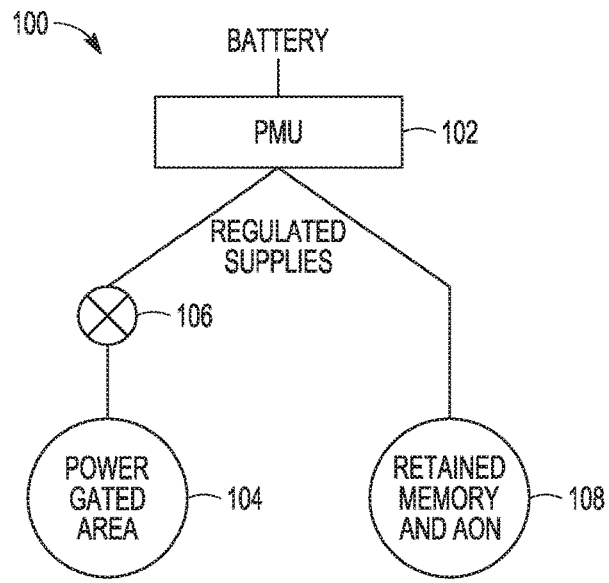
FIG. 1 is a block diagram of portions of an example of an electronic system.

FIG. 1 is a block diagram of portions of an electronic system 100 that is operable in a low power mode and an active mode. The system includes a power management unit (PMU) 102 that handles all the power management routines required for a microcontroller based ultra-low power electronic system, such as among other things, power up, active mode regulation, low power or hibernate mode, power modes transition, alarms, and reset checks and handling. The circuitry of the electronic system 100 is divided into a gated circuitry area 104 where the power is gated by enable circuitry 106 and an always-on circuitry area 108. For example, a microcontroller may be included in the gated circuitry area and kept in a power down status during a low power mode, and a certain amount of memory may be included in the always-on (AON) circuitry area where power is retained during the low power mode.

The electronic system may be battery-powered. A challenge to implement a low power mode is the reduction of current consumption in order to maximize the battery life. To reduce leakage current, most of the digital circuitry is power-gated in this mode, but because it is desired to retain power for some memory of the system, a regulated voltage needs be kept active. Also, the always-on circuitry needs to include some circuitry that should be kept active to manage the wakeup sequence of the electronic system from the low power mode.

Figure 2:
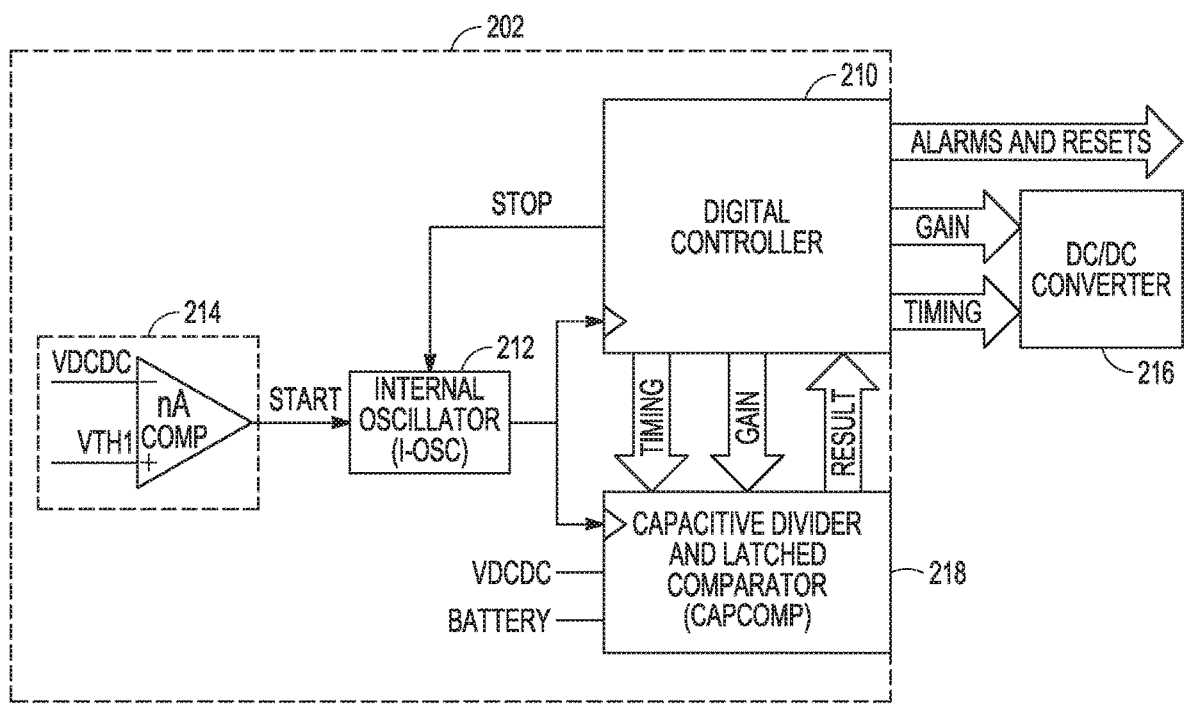
FIG. 2 is a block diagram of portions of an example of a power management unit used in a low power mode.

FIG. 2 is a block diagram of portions of a PMU 202 used for the low power mode. The PMU 202 includes various analog and digital circuits designed to work together to maximize energy efficiency, while keeping all the functionalities required for a safe power down in low power mode. FIG. 2 only shows the blocks active in the low power mode, while extra components active for the active mode are not shown. While FIG. 2 shows the circuit components active in the low power mode, not all the components in FIG. 2 are always active in the low power mode.

FIG. 2 also shows a power converter circuit 216 operatively coupled to the PMU 202. The power converter circuit 216 may be a direct current (DC) to DC switching power converter circuit. The power converter circuit 216 may be a pulse frequency modulated (PFM) power converter circuit. The power converter circuit 216 provides regulated output voltage (VDCDC). In some aspects, the power converter circuit 216 is a capacitive switched DC to DC converter circuit.

Figure 3:
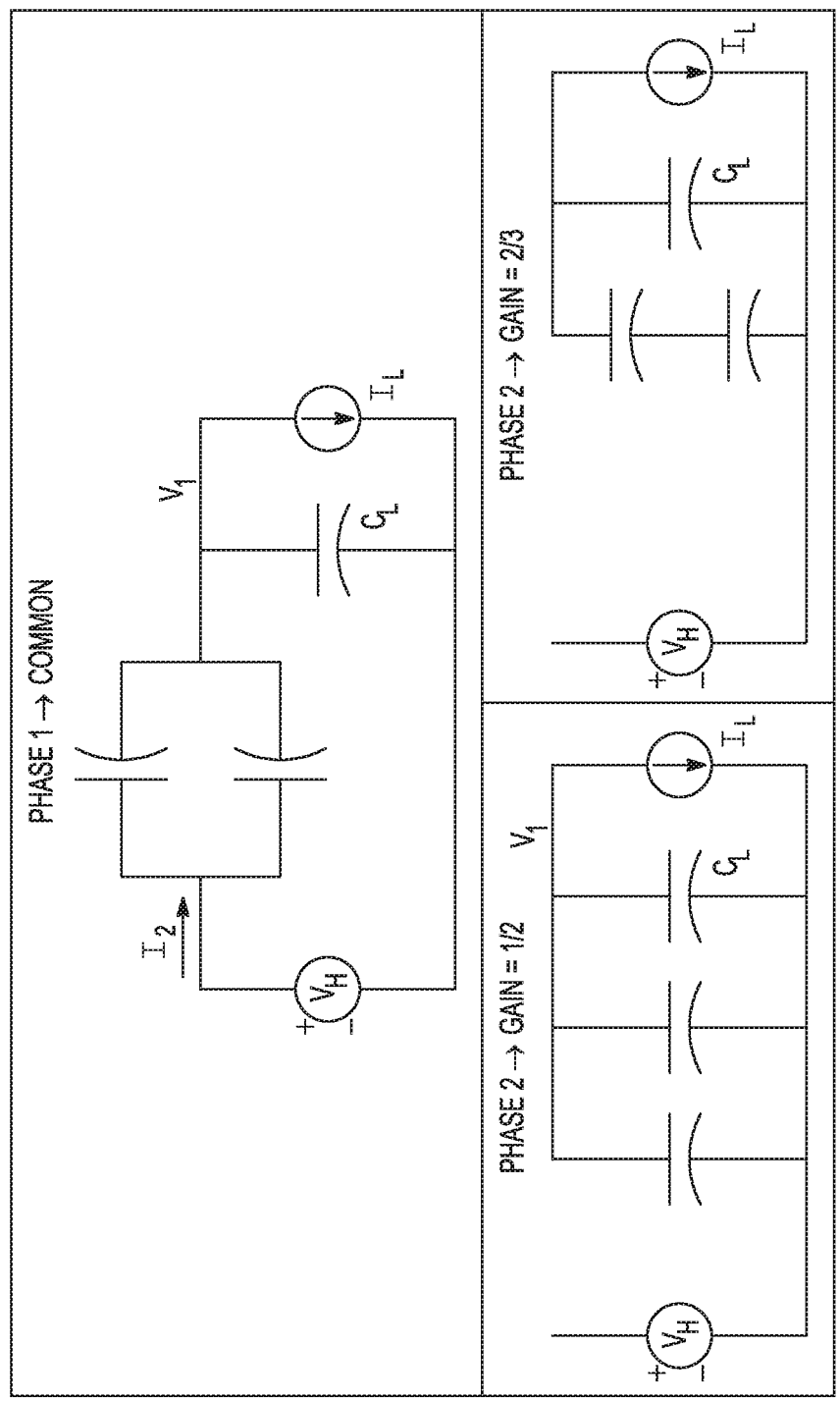
FIG. 3 is a circuit diagram of an example of a capacitive switched converter circuit.
Figure 4:
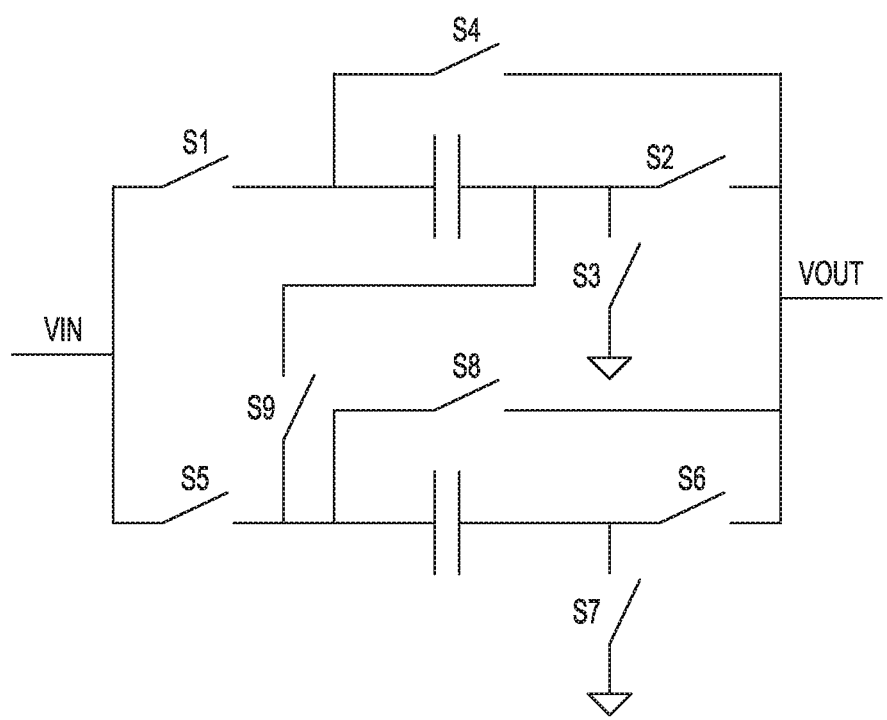
FIG. 4 is a schematic of an example of a circuit switches to configure the different gains for the capacitive switched converter circuit of FIG. 3.

FIG. 3 is a circuit diagram of an example of capacitor arrangements for a capacitive switched DC to DC buck converter circuit. The different capacitor arrangements apply gains of 1, ½, or ⅔ to the DC voltage input to the converter circuit. The arrangement of the capacitors and therefore the gain of the converter circuit is changed by circuit switches. FIG. 4 is a schematic of an example of a circuit switches to configure the different gains for the power converter circuit. In certain aspects, the PMU 202 and the power converter circuit 216 are integrated onto the same integrated circuit (IC) chip or die. The capacitors in FIG. 3 may be external to the IC.

The PMU 202 includes a controller 210, an oscillator circuit 212, and a monitoring circuit 214. The controller 210 may be a microcontroller, microprocessor, or application specific integrated circuit (ASIC) that interprets or executes instructions included in software or firmware. In variations, the controller 210 includes a logic sequencer that sequentially steps through a fixed series of steps to perform one or more functions. The steps are typically implemented in hardware or firmware. The controller 210 controls operation of the power converter circuit 216 in the low power mode and the active mode of the electronic system. In the low power mode, the controller 210 controls operation of the power converter circuit 216 by providing clock signals to the power converter circuit 216 and configuring switches to set the power converter circuit gain.

The oscillator circuit 212 can be integral to the PMU and the oscillator circuit 212 generates clock signals in the low power mode to control the operation of the power converter circuit 216. The clock signals are provided to the controller 210 which provides control signals to the power converter circuit to select the gain of the power converter circuit and generate the regulated output voltage of the power converter circuit.

The monitoring circuit 214 can include a comparator circuit. In the low power mode, the monitoring circuit 214 receives the regulated output voltage (VDCDC) from the power converter circuit 216 and compares the regulated output voltage to a specified voltage threshold (VTH1). The oscillator circuit 212 is only turned on when the regulated output voltage (VDCDC) is less than the specified threshold voltage (VTH1). When the regulated output voltage (VDCDC) is greater than the specified threshold voltage (VTH1) the monitoring circuit 214 turns off the oscillator circuit 212. To function is this manner, the oscillator circuit 212 should be able to turn on quickly. In some aspects, the regulated output voltage is charged to a second specified threshold (VTH2), such as VTH2=VTH1+Hysteresis. The hysteresis voltage may be 100 millivolts (100 mV) for example. The oscillator circuit 216 is turned on while the regulated output voltage is greater than VTH1.

The monitoring circuit 214 is the only always-on element of the PMU during the low power mode. If the monitoring circuit is a comparator, the comparator is the only circuit element of the power management unit enabled during the low power mode when the regulated output voltage is greater than the specified threshold voltage. The other circuit elements are disabled. When the regulated output voltage is less than the specified threshold voltage, the other circuit elements are enabled in the low power mode to control the power converter circuit 216 to generate the regulated output voltage.

The power converter circuit 216 can include one or more capacitors as shown in the circuit example of FIG. 3. In an illustrative example intended to be non-limiting, the flying capacitors of the power converter circuit may be 100 nano-Farads (100 nF) and the hold capacitor ($C_L$) may be 1 micro-Farad (1 μF). If the load current in the low power mode is low enough (e.g., 1 micro-Amp or 1 μA), the discharge rate of the hold capacitor is extremely slow. This means that if the power converter circuit charges the output to a voltage VTH2 higher than the specified voltage threshold (VTH1) (e.g., VTH2≈VTH1+100 mV), the power converter circuit 216 can be powered off and the output VDCDC slowly discharges until it reaches VTH1. If the discharge rate is slow compared to the charge rate of the buck converter, the converter will be off most of the time, thus minimizing power consumption.

If the current capability of the power converter circuit is high enough, it takes only a few clock cycles to charge the output and the charge rate is much faster than the discharge rate. This allows the PMU to be powered down most of the time.

Figure 5:
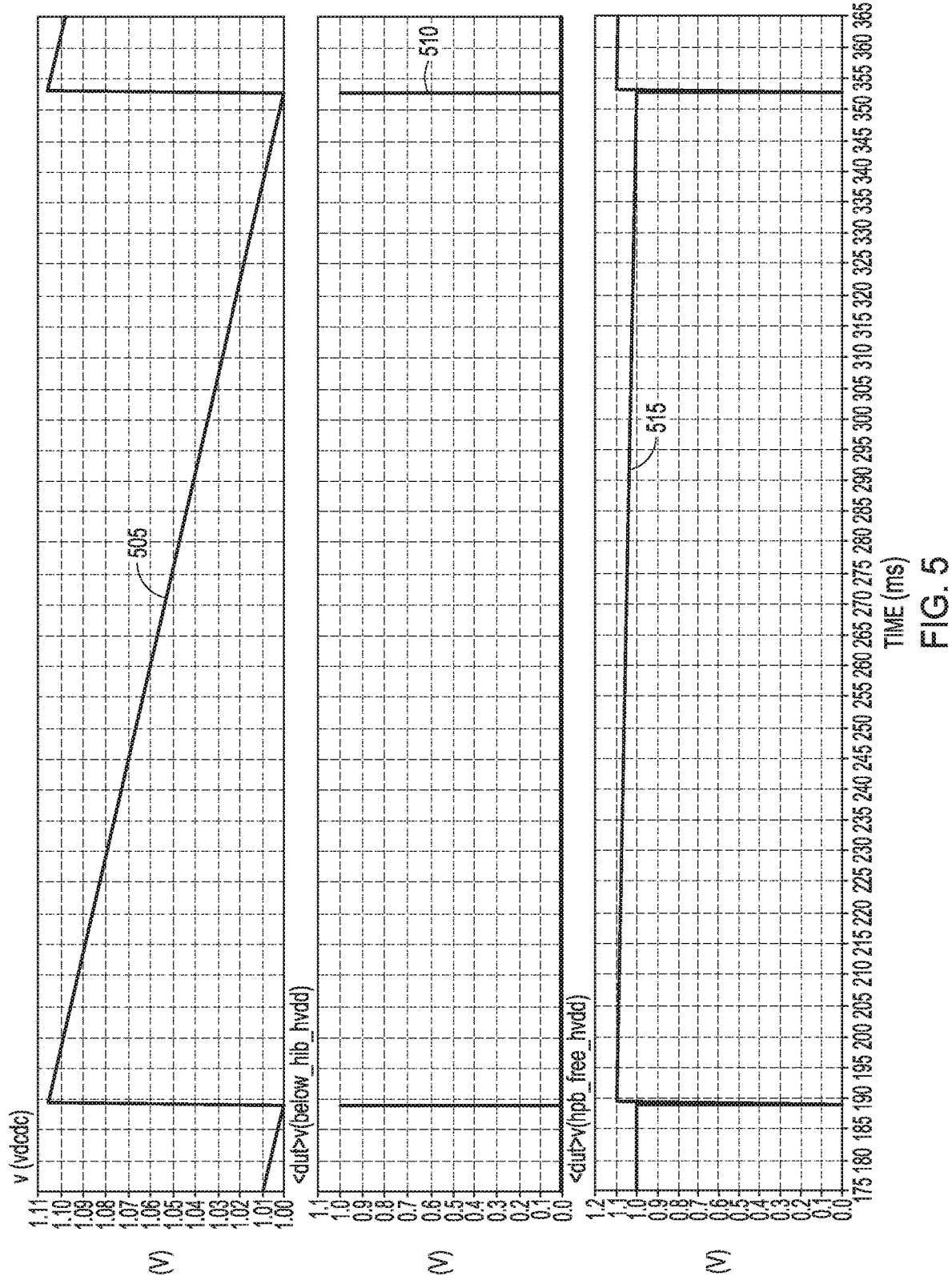
FIG. 5 and FIG. 6 are simulation waveforms for the capacitive switched converter circuit of FIGS. 3 and 4.

FIG. 5 shows simulation waveforms for the capacitive switched DC to DC buck converter circuit of FIGS. 3 and 4. The top waveform 505 is the output of the converter circuit and shows the output charging to VTH2 and discharging to VTH1. The middle waveform 510 is the output of the always-on comparator circuit, and the bottom waveform 515 is a signal that indicates in the high state that the converter circuit is an idle state and is slowly discharging.

Figure 6:
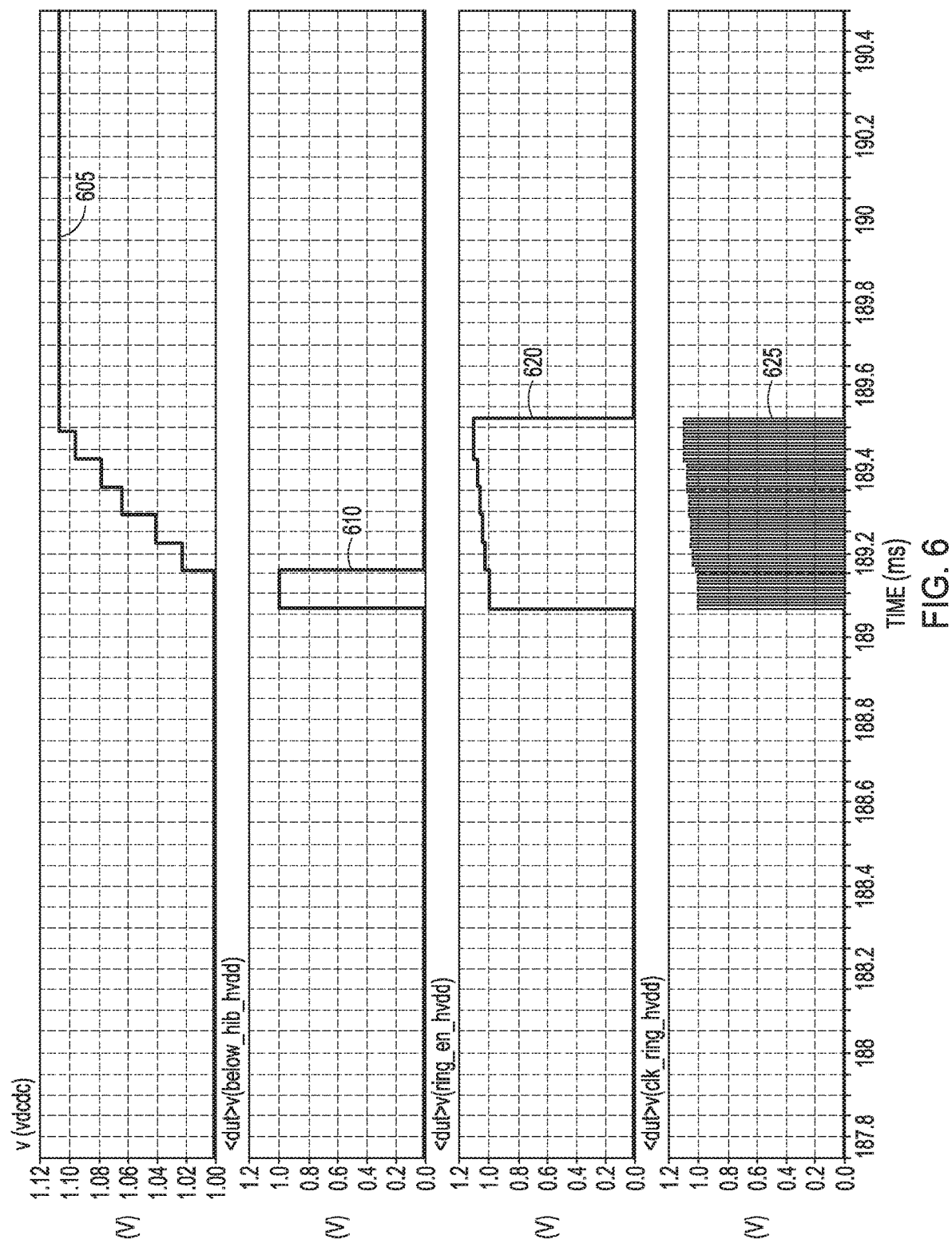

FIG. 6 also shows simulation waveforms for the capacitive switched DC to DC buck converter circuit of FIGS. 3 and 4. The top waveform 605 is an expanded view of the charging portion of waveform 505 of FIG. 5. The second waveform 610 is an expanded view of the output signal from the comparator circuit. The third waveform 620 is an enable for the oscillator circuit and fourth waveform 625 is the output of oscillator circuit output. It can be seen from FIG. 6 that oscillator circuit 212 of FIG. 2 only needs to be active during the charge phase of the power converter circuit 216. Thus, the oscillator circuit 212 can be turned off while VDCDC is greater than VTH1. The ramp evident on the amplitude on the oscillator circuit in waveform 625 is the charging of VDCDC which is the circuit supply of the oscillator circuit.

As explained previously herein, a comparator of the monitoring circuit may be the only circuit element of the power management unit enabled during the low power mode when the regulated output voltage is greater than the specified threshold voltage and the power converter circuit is discharging. The comparator circuit can receive the regulated output voltage from a capacitor as a circuit supply voltage. In this way, the output level is always monitored even while the power converter circuit is discharging. Using an external capacitor (e.g., an external hold capacitor) allows for low discharge rates, while using external flying capacitors allows for fast charge up times. This is an advantage of reusing the active mode regulator in the low power mode instead of having dedicated circuitry for the low power mode.

The PMU 202 can also perform battery monitoring. The battery voltage only needs to be monitored while the power converter circuit 216 is charging when the drain on the battery would greatest. Performing battery monitoring at the same time as the regulated output voltage is being charged allows the clock of the system to be gated, thus minimizing the dynamic component of the PMU current consumption. Also, because of the slow discharge rate, the comparator used to detect the crossing of VTH1 does not need wide bandwidth, which translates into a biasing current as low as 10 nA for the comparator circuit. Combining low static current consumption and the clock gating technique translates into extremely high efficiency for power management of the electronic system. The power management of the system is also self-adaptive, in the sense that for higher loads the system will be turned on more frequently, while for lower loads it will keep itself in an idle state for longer periods. This means that efficiency is kept almost constant for all loads.

FIG. 2 further shows a capacitive divider circuit 218 that is operatively coupled to a latched comparator (CAPCOMP in FIG. 2). The CAPCOMP circuit can be used as a high precision measuring system when the PMU is activated to perform the various supply measurements used by the monitoring state machines. The controller 210 controls the capacitive divider circuit to select gain values for the regulated output voltage monitoring and the battery monitoring. These gain values are different from the converter gain configured in the power converter circuit 216. The gain values of the capacitive divider circuit 218 are used to set the monitoring thresholds for the power converter circuit (e.g., VTH1 and VTH2) and the battery voltage (VBAT). The latched comparator of the CAPCOMP circuit compares the result of the multiplying the monitored supply by the selected gain against a reference voltage. A latched comparator is a comparator circuit that only performs the comparison when receiving a clock pulse. The power consumption of the latched comparator is purely dynamic, thereby maximizing power efficiency.

As explained previously herein, the oscillator circuit 212 should be able to start up quickly. Regarding frequency of the oscillator circuit, the actual frequency is not important for efficiency. A faster frequency will increase current consumption during the charge phase, as the dynamic current consumption is directly proportional to the clock frequency, but the charge phase will also be shorter. The number of clock cycles that the power converter circuit 216 needs to restore the regulated output voltage does not depend on the frequency, so a faster clock will produce the same clock cycles in less time than a slower one, which means that the charge time is reduced.

Figure 7:
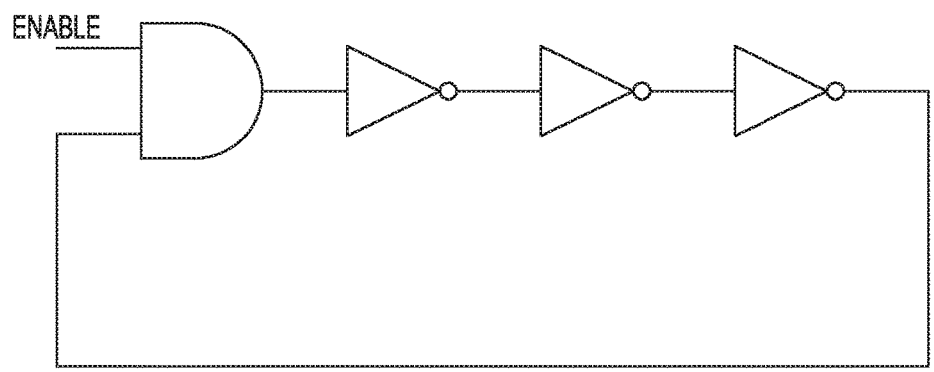
FIG. 7 is a circuit schematic of an example of an internal oscillator circuit.

FIG. 7 is a circuit schematic of an example of the oscillator circuit 212. The circuit is a ring oscillator and meets the requirements of startup and frequency for low power mode of the PMU. The only portion of the PMU 202 that may be sensitive to frequency is the capacitive divider circuit 218. For lower frequencies, leakage can cause the discharge of the sampling capacitors. This leakage may cause an error in the comparison. For higher frequencies, if the clock signal is too fast, the charging phase of the capacitor may not be completed to a steady value of stored charge, which will also cause an error in the comparison. The frequency of the internal oscillator circuit 212 can safely vary between 40 kHz and 200 kHz without affecting result of the capacitive divider by more than 1 mV.

Figure 8:
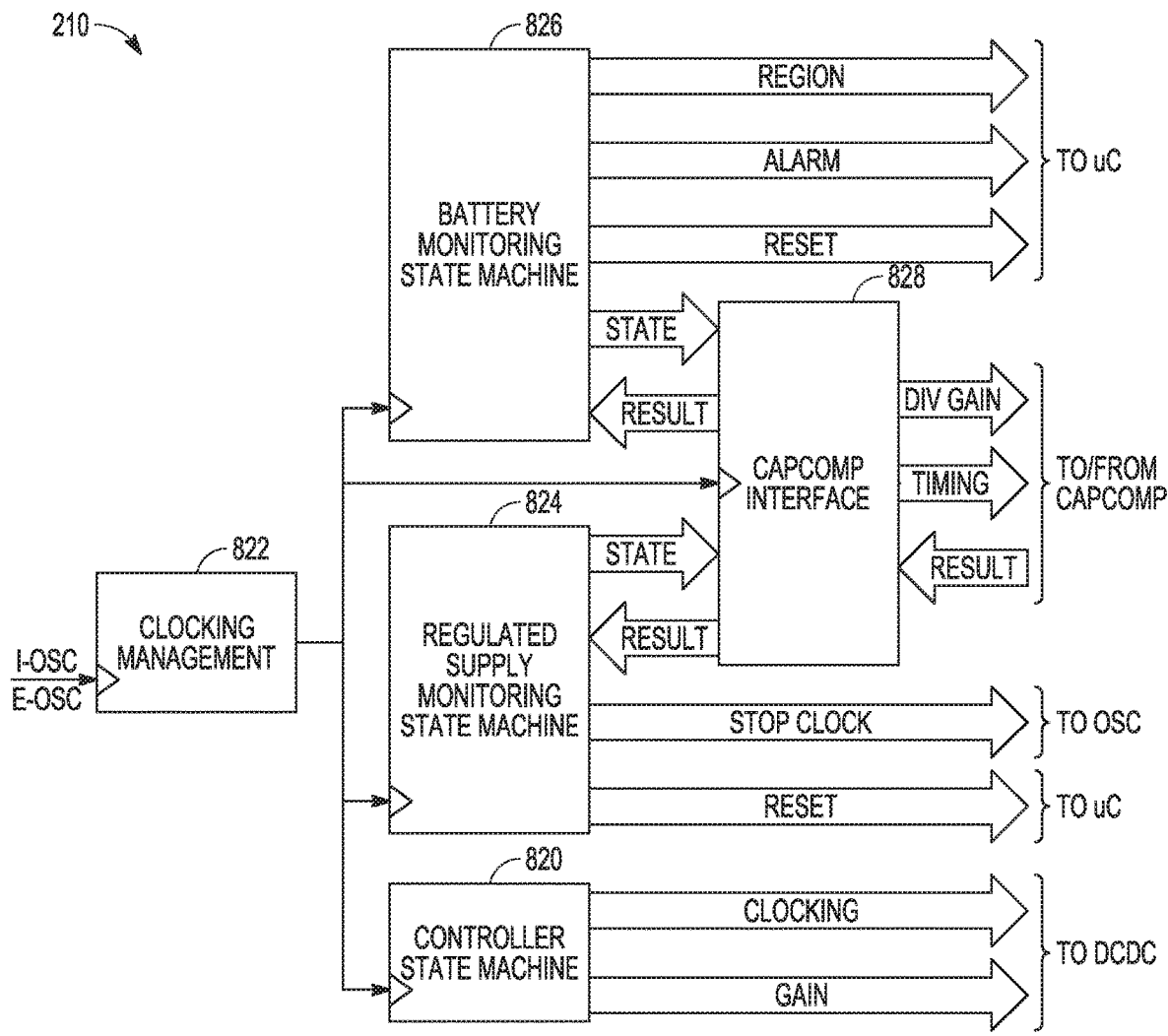
FIG. 8 is a block diagram of portions of an example of a controller of a power management unit.

FIG. 8 is a block diagram of portions of the controller 210 of the PMU of FIG. 2. The diagram shows that the controller 210 implements three state machines; one to control the power converter, one to monitor the regulated output voltage, and one to monitor the battery voltage. The controller 210 includes a clocking management module 822. A "module" includes hardware circuitry or firmware executable by the controller to perform the functions described. The function of the clocking management module is to divide and distribute the clock signals to the other blocks of the controller 210. In the low power mode, the clocking management module 822 uses one or more clock signals (I-OSC) received from the oscillator circuit 212 of FIG. 2 to generate the clock signals used by the state machines. In the active mode, the requirements for the clock signals input to the clocking management module become more stringent and a separate oscillator circuit external to the PMU is used to provide the input clock signals (E-OSC).

The controller 210 includes a power converter controller state machine 820. The controller state machine controls operation of the power converter circuit 216 of FIG. 2 in the low power mode to generate the regulated output voltage VDCDC. It provides the clock signals and the gain settings for the power converter circuit 216. It may also control operation of the power converter circuit 216 when the system is in the active mode to generate the main regulated supply voltage for the electronic system.

Figure 9:
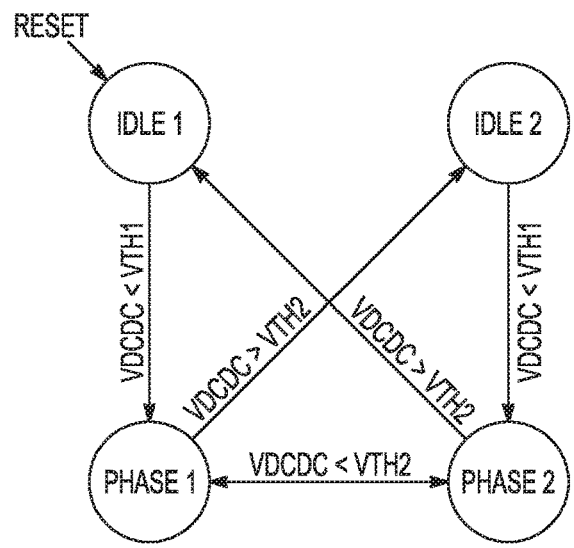
FIG. 9 is a state diagram of a power converter controller state machine of a power management unit.

FIG. 9 is a state diagram for the power converter controller state machine 820 in the low power mode. The outputs of the state machine provided from the controller to the power converter circuit include the gain setting for the converter circuit and two clock signals, PHASE 1 and PHASE 2. The gain setting is set according to the battery voltage as determined by the battery voltage monitoring state machine. For example, the gain setting may be increased as the battery voltage decreases to maintain the desired level of the regulated output voltage. The PHASE signals may be two phases of a non-overlapping clock provided to a capacitive switched DC to DC converter circuit.

In operation, the power converter controller state machine 820 is kept in idle state while VDCDC is greater than VTH1, and the power converter circuit is in the discharge phase and is not charging. Once the monitoring circuit triggers because VDCDC is less than VTH1, PHASE 1 and PHASE 2 are alternated until VDCDC reaches VTH2. Because PHASE 1 and PHASE2 are part of a non-overlapping clock, there is a segment of the non-overlapping clock where both PHASE1 and PHASE2 are low.

Returning to FIG. 8, the two monitoring state machines are a regulated output voltage monitoring state machine 824 and a battery voltage monitoring state machine 826. The controller 210 implements the two state machines during two different monitoring phases of the low power mode and monitors the battery voltage on the opposite phase of monitoring the regulated output voltage.

Figure 10:
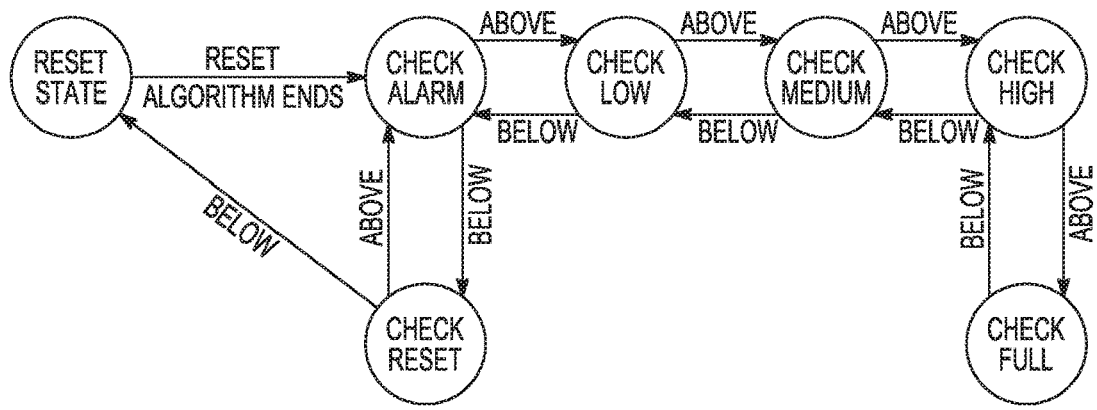
FIG. 10 is a state diagram of a battery voltage monitoring state machine of a power management unit.

FIG. 10 is a state diagram of the battery voltage monitoring state machine 826. Each state determines a different gain setting for the power converter circuit. This state machine is the same for the active mode, which simplifies transitioning between the active and low power modes. The number of states for the battery monitoring depends on the number of available gains of the power converter circuit. In each clock cycle the battery is compared against the lower or higher threshold of the current region (e.g., one of Low region, Medium region, High region, Full region, Alarm, etc.) using the capacitive divider circuit, and the state is maintained or updated based on the comparison.

Figure 11:
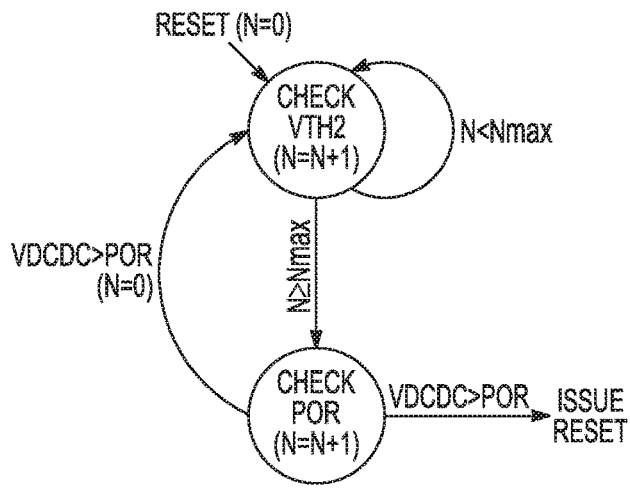
FIG. 11 is a state diagram of a regulated output voltage monitoring state machine of a power management unit.

FIG. 11 is a state diagram of the regulated output voltage monitoring state machine 824. The state machine includes a counter (N=N+1) to determine the number of clock cycles that the converter has been active during one charge cycle. When this counter reaches a maximum value, the regulated output voltage VDCDC is checked again its reset voltage threshold (power on reset, or POR). This is a security feature to avoid VDCDC from dropping below the retention voltage of the memories. Under normal loading conditions, this counter should never expire, and the POR level should not be reached because the output is being charged to VTH2. If the load increases, the converter should still be able to charge VDCDC to VTH2. In case of an unusually high load, especially if the battery is close to a gain region lower threshold, a continuous mode is possible where VTH2 is never achieved. In continuous mode, clock gating cannot be applied and current consumption increases, but because this happens only at unusually high load currents, efficiency is not affected. Running in continuous mode is acceptable if VDCDC remains above the POR level, but if VDCDC keeps falling and becomes less than the POR level, a reset is issued.

As explained previously herein, the clocking management module 822 of FIG. 8 distributes the clock signals to the other portions of the controller 210. The clocking management module 822 also synchronizes the two monitoring state machines with the capacitive divider circuit. This is done using the capacitive divider circuit interface 828. The capacitive divider circuit interface 828 translates the comparison requests of the monitoring state machines into the various gains of the capacitive divider circuit 218.

Figure 12:
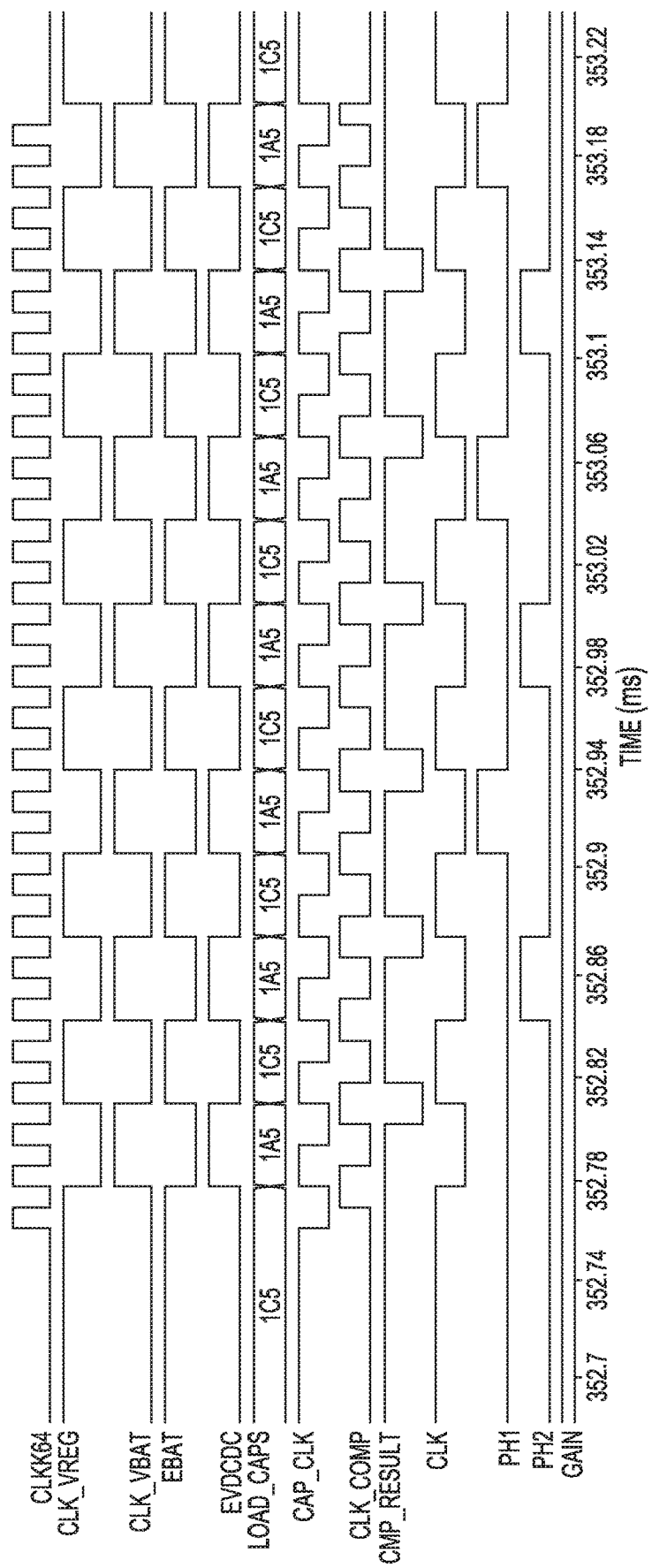
FIG. 12 is a timing diagram of signals generated by circuitry of the power management unit.

FIG. 12 is a timing diagram of signals generated by the clocking management module 822 to synchronize the timing of the three state machines and the capacitive divider circuit. The signal labeled CLK64 is the input clock from the internal oscillator circuit I-OSC or an external oscillator circuit E-OSC.

The signals labeled CLK_VREG and CLK_VBAT are the clock signals generated for the regulated output voltage monitoring state machine 824 and the battery voltage monitoring state machine 826, respectively. The signals labeled EBAT and EVDCDC are enable signals that define the phase of the monitoring (i.e., which supply is being monitored) using the capacitive divider circuit. When EBAT is active (e.g., high in FIG. 12), the PMU is in the battery voltage monitoring phase and the gain of the capacitive divider circuit 218 is set to monitor the different thresholds related to the battery voltage monitoring state machine 826. When EVDCDC is active, the PMU is in the regulated output voltage monitoring phase and the gain of the capacitive divider circuit 218 is set to monitor the different thresholds related to the regulated output voltage monitoring state machine 824.

The signal labeled LOAD_CAPS is the gain value for the capacitive divider circuit 218. Note that the gain value switches back and forth with the enabling of the corresponding monitoring state machine. The gain value used for each of the monitoring state machines is selected from multiple gain values available for each of the monitoring state machines. The signal CAP_CLR indicates the portion of the monitoring phase in which the capacitors of the capacitive divider circuit 218 are cleared and the gain value is updated. One cycle of the CAP_CLR signal is two cycles on the input clock signal CLK64. The capacitors are cleared as long as CAP_CLR is high. The capacitive division takes place when CAP_CLAR goes low. The comparison with the latched comparator of the capacitive divider circuit 218 occurs when CLK_COMP goes high. The signal CMP_RESULT is the result of the comparison. CMP_RESULT is high if the supply is above the selected threshold and vice versa.

It should be noted that while the battery monitoring state machine 726 is active, the capacitive divider circuit 218 is evaluating the regulated output voltage, and vice versa, the capacitive divider circuit 218 is evaluating the battery voltage while the regulated output voltage monitoring state machine 824 is active. This allows the result of each comparison to reach the appropriate state machine on the positive edge of its corresponding clock. It should also be noted that these clock signals are generated during the low power mode only while the oscillator circuit 212 in FIG. 2 is activated, corresponding to the clock switching time of waveform 625 in FIG. 6.

While the signaling is provided to the monitoring state machines, the clocking management module 822 is also providing clock signals to the power converter controller state machine 820 to operate as described previously herein regarding FIG. 9. The power converter controller state machine 820 runs at same frequency as the monitoring state machines and is synchronized with the clock of regulated output voltage monitoring state machine 824 so that at each positive edge of the clock the capacitive divider circuit 218 is checking the regulated output voltage against VTH2 in order to stop the charging cycles. Returning to FIG. 12, PH1 and PH2 are PHASE1 and PHASE2 of the power converter controller state machine 820. The signal GAIN is the gain setting for the power converter circuit 216 of FIG. 2. As explained previously herein the value of GAIN for the power converter circuit 216 may be set according to the value of the battery voltage.

Figure 13:
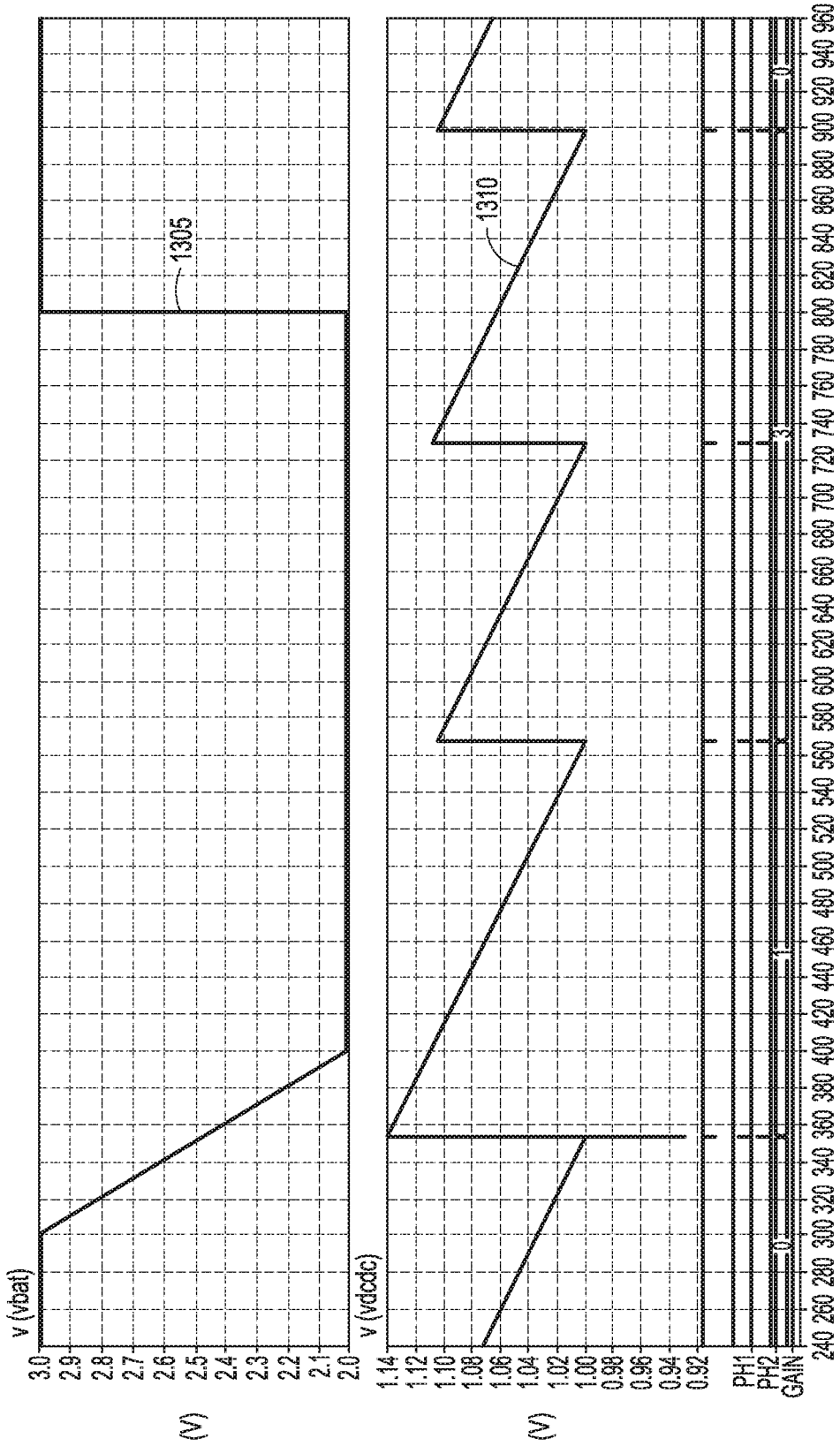
FIG. 13 shows simulation waveforms associated with the power management unit.

FIG. 13 shows simulation waveforms associated with the PMU when there is a glitch in the battery voltage that results in a change in the value of GAIN. The top waveform 1305 is the battery voltage (VBAT) and the second waveform 1310 is the regulated output voltage (VDCDC). At the bottom of FIG. 13 are waveforms associated with the power converter controller state machine 820 including PH1, PH2 and GAIN. In the example of FIG. 13, VBAT drops from 3V to 2V. The value of GAIN is shown changing with the voltage glitch and changing back when the glitch is gone.

In real applications, the battery is expected to drop at rates that are orders of magnitude slower than the discharge rate of the power converter circuit 216 (e.g., days, months or even years). A sudden drop in the battery is out of spec for these types of power monitors because a voltage drop as shown in the simulation is very abnormal and typically requires a reset. A failsafe reset detector may be integrated in the PMU to detect this type of battery event and reset the system.

As explained previously herein, the controller 210 in FIG. 2 controls operation of the power converter circuit 216 in the low power mode and the active mode of the electronic system. The controller 210 may exit the low power mode and enter the active mode in response to receiving an interrupt signal. The interrupt signal may be sent by a separate device or process of the system or may be generated by a sensor of the system.

In the active mode, the controller 210 operates the power converter circuit 216 to generate a main supply voltage. The domain of the main supply for the system in the active mode has a lower tolerance for noise than the supply domains in the low power mode to avoid introducing glitches in the digital circuits, corrupting data during read/write operations, lowering analog-to-digital converter (ADC) performance, digital-to-analog converter (DAC) performance etc. In the active mode, a low drop out (LDO) regulator is added in series with the power converter circuit 216 to maintain the main supply voltage HVDD.

Figure 14:
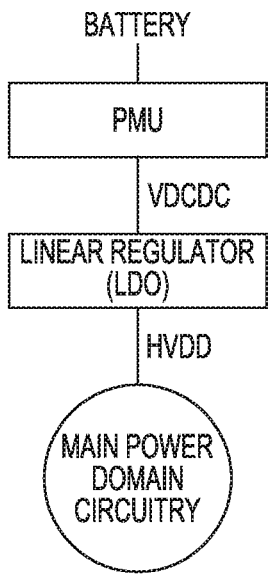
FIG. 14 is a block diagram of portions of the electronic system of FIG. 1 in an active mode.

FIG. 14 is a block diagram of portions of the electronic system of FIG. 1 in the active mode. The LDO can provide a low-noise main supply domain due to a high power supply rejection ratio (PSRR). This approach can be expanded to divide the system into multiple supply domains by increasing the number of linear regulators, which can be useful to separate noisy and clean power rails, as well as to obtain a multi-voltage system. In the active mode, the PMU 202 monitors the output of the LDO instead of the output voltage of the power converter circuit 216 because the output of the LDO is the actual operating voltage of most of the system (e.g., microcontroller, ADC, memories etc.).

As far as the power converter circuit 216 is concerned, the same concepts as in the low power mode can be applied. A series of pulses can charge the output of the power converter from a lower threshold to a higher one. The power converter circuit then can be halted until the lower threshold is hit again. The difference between the low power mode and the active mode is that the dynamics of this process happen at higher frequencies in the active mode because the current load on the circuit supply can be in the milli-Amperes range.

As explained previously herein, the power converter circuit can be a PFM power converter. Using a PFM power converter for the power converter circuit 216 reduces the basal current used in the conversion. However, this reduction in basal current is more relevant for the low power mode than for the active mode. An advantage of using a PFM converter in the active mode is that the system is less noisy. Another advantage is that the output voltage of the power converter circuit 216 can be kept in the region where it is safe to use core transistors instead of battery domain transistors. This leads to significant area reduction of the power transistor or transistors used in the LDO.

Because of the higher frequencies, the comparator (typically biased using nano-Amperes) of the low power mode monitoring circuit 214 may not have enough bandwidth to catch the crossing of the lower threshold voltage and react without letting the main supply droop too much. For the same reason, sampling of the output of the power converter at frequencies of tenths of kHz is not enough to catch the higher threshold voltage limit in time to stop the charge phase from reaching dangerously high voltages. Additionally, switching the capacitors of the power converters at frequencies of tenths of kHz may not provide enough current capability to maintain a regulated supply voltage HVDD.

Figure 15:
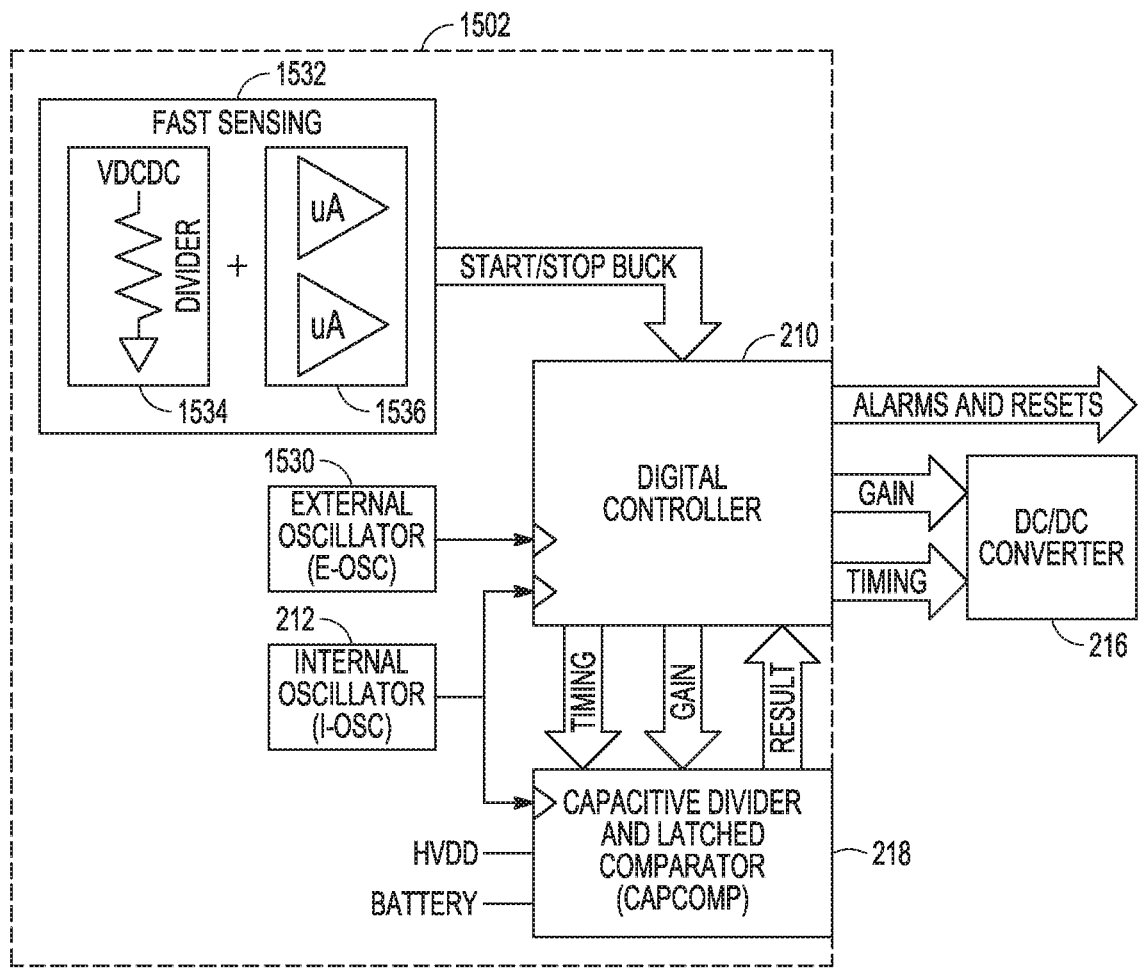
FIG. 15 is a block diagram of portions of a power management unit in an active mode.

FIG. 15 is a block diagram of portions of a PMU 1502 and power converter circuit 216 used for the active mode. The main portions of the PMU are mostly the same as for the low power mode. The external oscillator 1530 is added in the active mode to clock the power converter circuit at a higher frequency and the monitoring circuit 214 of FIG. 2 is replaced with monitoring circuit 1532. The monitoring circuit 1532 includes resistive divider 1534 and two high bandwidth comparators 1536 to check the output of the power converter circuit against voltage thresholds VTH1 and VTH2. In variations, the comparators are clocked comparators that are clocked at a high frequency.

Figure 16:
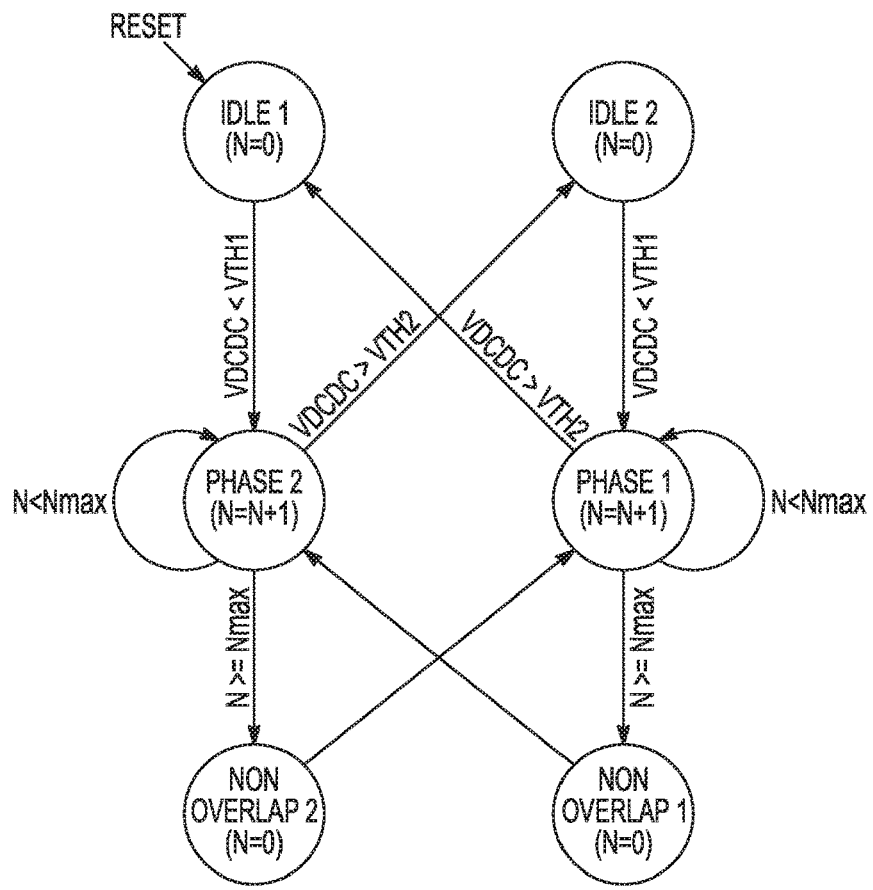
FIG. 16 is a state diagram of another example of a power converter controller state machine of a power management unit.

FIG. 16 is a state diagram of the power converter controller state machine in the active mode. The power converter circuit works in the hundreds of kilohertz frequency region in the active mode to maximize current capability. An external clock source (E-OSC) can be used together with the power converter controller state machine to provide the timing of the power converter circuit in the active mode. As in the low power mode, two idle states are present, as well as the PHASE1 and PHASE2 states. A counter (N=N+1) is used to divide the input clock and obtain PHASE1 and PHASE2 at the desired frequency. Two extra states are added to obtain a reliable non-overlapping of PHASE1 and PHASE2. In this example, the non-overlapping portion consists of one clock cycle, adding a counter in those states can also be done to increase the non-overlapping time if the input clock period is too short for a correct non-overlapping.

The slow internal clock (internal oscillator circuit 212) can be used for the battery voltage monitor state machine in the active mode because the battery discharge rate is assumed to be as slow in the active mode as in the low power mode, and the battery monitoring state machine and the internal oscillator circuit may still be on during the active mode. The timing of the battery voltage monitor state machine is the same as in low power mode, so the transition of battery monitoring between low power mode and active mode is relatively simple.

Figure 17:
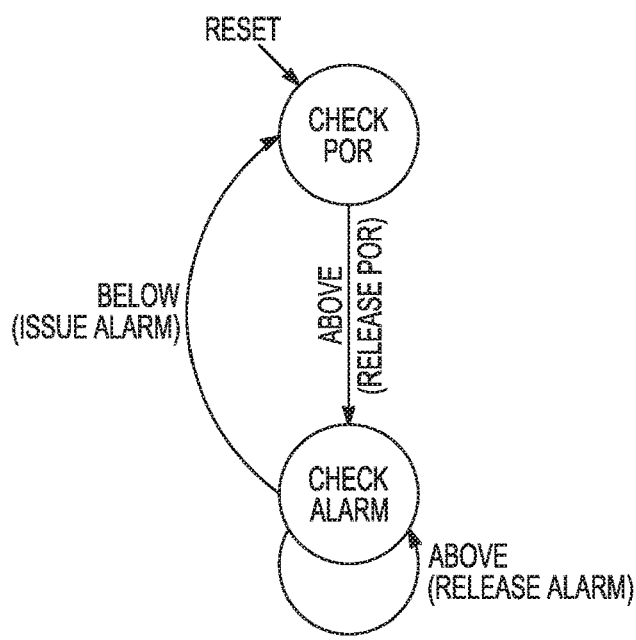
FIG. 17 is a state diagram of an example of a main circuit supply voltage monitoring state machine of a power management unit.

The capacitive divider circuit 218 of FIG. 2 is too slow to monitor the output of the power converter circuit in the active mode, so the timeslot for the phase used to measure the regulated output supply becomes available for use to sense another supply. Because the main supply HVDD is usually a stable voltage, it is useful to add a precise monitor and check if the value of HVDD is in the desired range. The regulated output voltage monitoring state machine becomes available to monitor HVDD. FIG. 17 is a state diagram of the HVDD voltage monitoring state machine. The state machine checks to see if the main supply voltage HVDD is in the desired range. If HVDD is not in the desired range, an alarm and then a reset are issued.

The gain value of the capacitive divider circuit used for the HVDD monitoring may be a value selected from the gain values used to monitor VDCDC or a different gain value. The gain values for the capacitive divider circuit 218 may switch back and for the between a gain value to monitor the battery voltage (VBAT) and a gain value to monitor HVDD.

Figure 18:
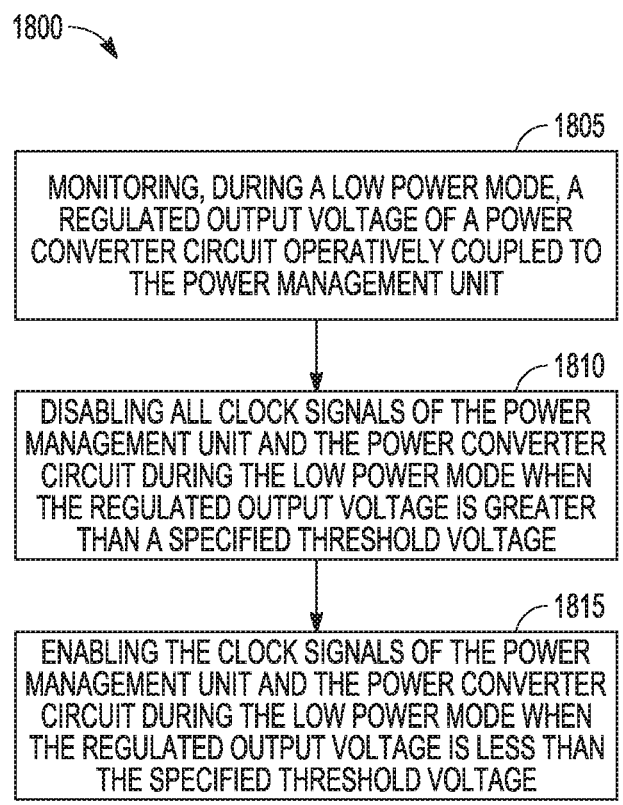
FIG. 18 is flow diagram of an example of a method of operating a power management unit.

FIG. 18 is a flow diagram of a method of operating a power management unit of an electronic system. The electronic system may be a battery powered electronic system. The electronic system may be microcontroller-based ultra-low power electronic system. The electronic system includes a power converter circuit operatively coupled to the power management unit. The power converter circuit may be a PFM converter circuit. The power converter circuit may be a switched capacitor DC to DC converter circuit.

At 1805, the regulated output voltage of a power converter circuit is monitored during a low power mode. The electronic system operates in the low power mode and an active mode. The electronic system may include one or more gated power domains. In the low power mode, the gated power domains are disabled.

At 1810, all clock signals of the power management unit and the power converter circuit are disabled during the low power mode when the regulated output voltage is greater than a specified threshold voltage. The power management unit includes a comparator circuit that compares the regulated output voltage to the specified threshold voltage. In some aspects, the comparator circuit is the only circuit element of the power management unit enabled during the low power mode when the regulated output voltage is greater than the specified threshold voltage. While the regulated voltage is greater, the power converter circuit is allowed to discharge in the low power mode.

At 1815, the clock signals of the power management unit and the power converter circuit are enabled during the low power mode when the regulated output voltage is less than the specified threshold voltage. When the regulated supply decreases below the specified threshold, circuitry of the power management unit is enabled and provided clocks to perform the monitoring tasks needed in the low power mode while the power converter circuit is charging the converter output voltage. The rest of the electronic system remains disabled. An interrupt may cause the electronic system to awaken from the low power mode and perform functions in the active mode. One or more of the gated power domains are enabled during the active mode and the electronic system operates normally. Some interrupt circuitry may be included in an always-on domain of the system to manage the wake-up sequence. When the tasks are complete, the electronic system may re-enter low power mode and the gated power domains are again disabled.

ADDITIONAL DESCRIPTION AND ASPECTS

Aspect 1 can include subject matter (such as a power management unit) comprising a controller configured to control operation of a power converter circuit in a low power mode and an active mode, an oscillator circuit configured to generate clock signals in the low power mode to control the operation of the power converter circuit, and a monitoring circuit. The monitoring circuit is configured, when in the low power mode, to receive a regulated output voltage from the power converter circuit, compare the regulated output voltage to a specified voltage threshold, and turn off the oscillator circuit when the regulated output voltage is greater than the specified threshold voltage and turn on the oscillator circuit when the regulated output voltage is less than the specified threshold voltage.

In Aspect 2, the subject matter of Aspect 1 optionally includes a monitoring circuit that is a first comparator circuit. The first comparator circuit is configured as an only circuit element of the power management unit always enabled during the low power mode.

In Aspect 3, the subject matter of Aspect 2 optionally includes a power converter circuit. The power converter circuit including a capacitor, and the first comparator circuit receives the regulated output voltage from the capacitor as a circuit supply voltage.

In Aspect 4, the subject matter of Aspect 3 optionally includes a power converter circuit that is a capacitive switched direct current (DC) to DC converter circuit included on an integrated circuit (IC). The capacitive switched DC to DC converter circuit includes a capacitor external to the IC and the first comparator circuit receives the regulated output voltage from the capacitor external to the IC.

In Aspect 5, the subject matter of one or any combination of Aspects 2-4 optionally includes a controller configured to exit the low power mode and enter an active mode in response to receiving an interrupt signal, initiate generating a main supply voltage using the power converter circuit when in the active mode, and change from monitoring the regulated output voltage using the first comparator circuit when in the low power mode to monitoring the main supply voltage using a second comparator circuit when in the active mode.

In Aspect 6, the subject matter of Aspect 5 optionally includes a controller configured to implement a power converter controller state machine configured to control operation of the power converter circuit to generate the regulated output voltage when in the low power mode and generate the main supply voltage when in the active mode.

In Aspect 7, the subject matter of one or any combination of Aspects 1-6 optionally includes a capacitive divider circuit operatively coupled to the controller and configured to implement a first plurality of selectable gain values and a second plurality of selectable gain values. The controller is optionally configured to enable, during the low power mode when the regulated output voltage is less than the specified threshold voltage, a first monitoring phase that monitors the regulated output voltage and a second monitoring phase that monitors a battery voltage, and change a gain of the capacitive divider circuit to a first gain value of the first plurality of selectable gains values during the first monitoring phase and to a second gain value of the second plurality of selectable gain values during the second monitoring phase.

In Aspect 8, the subject matter of Aspect 7 optionally includes a controller configured to implement a regulated output voltage monitoring state machine during the first monitoring phase and implements a battery voltage monitoring state machine during the second monitoring phase.

In Aspect 9, the subject matter of one or both of Aspects 7 and 8 optionally includes a controller configured to exit the low power mode and enter an active mode in response to receiving an interrupt signal; initiate generating a main supply voltage for an electronic system coupled to the power management unit when in the active mode; enable, during the active mode, a first monitoring phase that monitors the main supply voltage and a second monitoring phase that monitors the battery voltage; and change the gain of the capacitive divider circuit to a third gain value to monitor the main supply voltage during the first monitoring phase of the active mode.

Aspect 10 can include subject matter (such as a method comprising acts, or a computer readable storage medium including instructions that, when performed by circuitry (e.g., a processor) of a power management unit, cause the power management unit to perform the acts), or can optionally be combined with one or any combination of Aspects 1-9 to include such subject matter, comprising monitoring, during a low power mode, a regulated output voltage of a power converter circuit operatively coupled to the power management unit, disabling all clock signals of the power management unit and the power converter circuit during the low power mode when the regulated output voltage is greater than a specified threshold voltage, and enabling the clock signals of the power management unit and the power converter circuit during the low power mode when the regulated output voltage is less than the specified threshold voltage.

In Aspect 11, the subject matter of Aspect 10 optionally includes comparing the regulated output voltage to the specified threshold voltage using a first comparator circuit of the power management unit, enabling only the first comparator circuit of the power management unit during the low power mode when the regulated output voltage is greater than the specified threshold voltage, and disabling all other circuit elements of the power management unit, and enabling both the first comparator circuit and the other circuit elements of the power management unit when the regulated output voltage is less than the specified threshold voltage.

In Aspect 12, the subject matter of Aspect 11 optionally includes providing the regulated output voltage to the first comparator circuit using a circuit capacitor of the power converter circuit.

In Aspect 13, the subject matter of one or both of Aspects 11 and 12 optionally include exiting the low power mode and entering an active mode in response to the power management unit receiving an interrupt signal; generating a main supply voltage for the electronic system when in the active mode; and changing from monitoring the regulated output voltage using the first comparator circuit when in the low power mode to monitoring the main supply voltage using a second comparator circuit when in the active mode.

In Aspect 14, the subject matter of one or any combination of Aspects 10-13 optionally includes enabling, during the low power mode, a first monitoring phase used for monitoring the regulated output voltage and a second monitoring phase used for monitoring a battery voltage.

In Aspect 15, the subject matter of Aspect 14 optionally includes monitoring the regulated output voltage and the battery voltage using a capacitive divider circuit configured to implement a first plurality of selectable gain values and a second plurality of selectable gain values, and changing a gain of the capacitive divider circuit to a first gain value of the first plurality of selectable gains values during the first monitoring phase and to a second gain value of the second plurality of selectable gain values during the second monitoring phase.

In Aspect 16, the subject matter of one or both of Aspects 14 and 15 optionally include exiting the low power mode and entering an active mode in response to the power management unit receiving an interrupt signal, generating a main supply voltage for the electronic system when in the active mode, enabling, during the active mode, a first monitoring phase that monitors the main supply voltage and a second monitoring phase that monitors the battery voltage, and changing the gain of the capacitor divider circuit to a third gain value to monitor the main supply voltage during the first monitoring phase of the active mode.

Aspect 17 includes subject matter (such as an electronic system) or can optionally be combined with one or any combination of Aspects 1-16 to include such subject matter, comprising a switching power converter circuit, and a power management unit operatively coupled to the switching power converter circuit. The power management circuit includes a controller configured to control operation of the switching power converter circuit in a low power mode and an active mode, an oscillator circuit configured to generate clock signals to control the operation of the switching power converter circuit in the low power mode; and a comparator circuit. The comparator circuit is configured to receive a regulated output voltage from the switching power converter circuit; compare the regulated output voltage to a specified voltage threshold; and generate a signal to turn off the oscillator circuit when the regulated output voltage is greater than the specified threshold voltage and turn on the oscillator circuit when the regulated output voltage is less than the specified threshold voltage.

In Aspect 18, the subject matter of Aspect 17 optionally includes a switching power converter circuit that includes a capacitor, and the comparator circuit is configured to receive the regulated output voltage from the capacitor as a circuit supply voltage, and the comparator circuit is further configured as the only circuit element of the power management unit enabled during the low power mode when the regulated output voltage is greater than the specified threshold voltage.

In Aspect 19, the subject matter of one or both of Aspects 17 and 18 optionally includes a controller configured to implement a first monitoring state machine during a first monitoring phase of the low power mode to monitor the output voltage of the switching power converter circuit and implement a second monitoring state machine during a second monitoring phase of the low power mode to monitor a battery voltage.

In Aspect 20, the subject matter of Aspect 19 optionally includes a capacitive divider circuit operatively coupled to the controller and configured to implement a first plurality of selectable gain values and a second plurality of selectable gain values. The controller is optionally configured to change a gain of the capacitive divider circuit to a first gain value of the first plurality of selectable gains values during the first monitoring phase and to a second gain value of the second plurality of selectable gain values during the second monitoring phase.

In Aspect 21, the subject matter of one or both of Aspects 19 and 20 optionally includes a controller configured to implement a power converter state machine to control the switching power converter circuit to generate the output voltage compared to the specified voltage threshold when in the low power mode and to generate a main supply voltage when in the active mode.

In Aspect 22, the subject matter of one or any combination of Aspects 19-21 optionally includes a switching power converter circuit that is a DC to DC converter circuit. The controller is optionally configured to set a gain of the switching power converter circuit according to the battery voltage.

These non-limiting Aspects can be combined in any permutation or combination. The above detailed description includes references to the accompanying drawings, which form a part of the detailed description. The drawings show, by way of illustration, specific embodiments in which the invention can be practiced. These embodiments are also referred to herein as "examples" or "aspects." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A power management unit comprising:
   a controller configured to control operation of a power converter circuit in a low power mode and an active mode;
   an oscillator circuit configured to generate clock signals provided to the controller in the low power mode and to control the operation of the power converter circuit in the low power mode; and
   a monitoring circuit configured when in the low power mode to:
   receive a regulated output voltage from the power converter circuit;
   compare the regulated output voltage to a specified voltage threshold; and
   turn off the oscillator circuit in the low power mode when the regulated output voltage is greater than the specified threshold voltage and turn on the oscillator circuit in the low power mode when the regulated output voltage is less than the specified threshold voltage.

2. The power management unit of claim 1, wherein the monitoring circuit is a first comparator circuit, the first comparator circuit configured as an only circuit element of the power management unit always enabled during the low power mode.

3. The power management unit of claim 2, including:
   the power converter circuit, the power converter circuit including a capacitor;
   wherein the first comparator circuit receives the regulated output voltage from the capacitor as a circuit supply voltage.

4. The power management circuit of claim 3, wherein the power converter circuit is a capacitive switched direct current (DC) to DC converter circuit included on an integrated circuit (IC), and the capacitive switched DC to DC converter circuit includes a capacitor external to the IC and the first comparator circuit receives the regulated output voltage from the capacitor external to the IC.

5. The power management unit of claim 2, wherein the controller is configured to:
   exit the low power mode and enter an active mode in response to receiving an interrupt signal;
   initiate generating a main supply voltage using the power converter circuit when in the active mode; and
   change from monitoring the regulated output voltage using the first comparator circuit when in the low power mode to monitoring the main supply voltage using a second comparator circuit when in the active mode.

6. The power management unit of claim 5, wherein the controller is configured to implement a power converter controller state machine configured to control operation of the power converter circuit to generate the regulated output voltage when in the low power mode and generate the main supply voltage when in the active mode.

7. The power management unit of claim 1, including:
   a capacitive divider circuit operatively coupled to the controller and configured to implement a first plurality of selectable gain values and a second plurality of selectable gain values;
   wherein the controller is configured to:
   enable, during the low power mode when the regulated output voltage is less than the specified threshold voltage, a first monitoring phase that monitors the regulated output voltage and a second monitoring phase that monitors a battery voltage; and
   change a gain of the capacitive divider circuit to a first gain value of the first plurality of selectable gains values during the first monitoring phase and to a second gain value of the second plurality of selectable gain values during the second monitoring phase.

8. The power management unit of claim 7, wherein the controller is configured to implement a regulated output voltage monitoring state machine during the first monitoring phase and implements a battery voltage monitoring state machine during the second monitoring phase.

9. The power management unit of claim 7, wherein the controller is configured to:
   exit the low power mode and enter an active mode in response to receiving an interrupt signal;
   initiate generating a main supply voltage for an electronic system coupled to the power management unit when in the active mode;
   enable, during the active mode, a first monitoring phase that monitors the main supply voltage and a second monitoring phase that monitors the battery voltage; and
   change the gain of the capacitive divider circuit to a third gain value to monitor the main supply voltage during the first monitoring phase of the active mode.

10. A method of operating a power management unit of an electronic system, the method comprising:
    operating the power management unit in an active mode and in a low power mode:
    monitoring, during the low power mode, a regulated output voltage of a power converter circuit operatively coupled to the power management unit;
    disabling clock signals of the power management unit and the power converter circuit during the low power mode when the regulated output voltage is greater than a specified threshold voltage; and enabling the clock signals of the power management unit and the power converter circuit during the low power mode when the regulated output voltage is less than the specified threshold voltage.

11. The method of claim 10, wherein monitoring the regulated output voltage includes:
comparing the regulated output voltage to the specified threshold voltage using a first comparator circuit of the power management unit;
enabling only the first comparator circuit of the power management unit during the low power mode when the regulated output voltage is greater than the specified threshold voltage, and disabling all other circuit elements of the power management unit; and
enabling both the first comparator circuit and the other circuit elements of the power management unit when the regulated output voltage is less than the specified threshold voltage.

12. The method of claim 11, including providing the regulated output voltage to the first comparator circuit using a circuit capacitor of the power converter circuit.

13. The method of claim 11, including:
exiting the low power mode and entering the active mode in response to the power management unit receiving an interrupt signal;
generating a main supply voltage for the electronic system when in the active mode; and
changing from monitoring the regulated output voltage using the first comparator circuit when in the low power mode to monitoring the main supply voltage using a second comparator circuit when in the active mode.

14. The method of claim 10, wherein enabling the clock signals includes enabling, during the low power mode, a first monitoring phase used for monitoring the regulated output voltage and a second monitoring phase used for monitoring a battery voltage.

15. The method of claim 14, including:
monitoring the regulated output voltage and the battery voltage using a capacitive divider circuit configured to implement a first plurality of selectable gain values and a second plurality of selectable gain values; and
changing a gain of the capacitive divider circuit to a first gain value of the first plurality of selectable gains values during the first monitoring phase and to a second gain value of the second plurality of selectable gain values during the second monitoring phase.

16. The method of claim 14, including:
exiting the low power mode and entering the active mode in response to the power management unit receiving an interrupt signal;
generating a main supply voltage for the electronic system when in the active mode;
enabling, during the active mode, a first monitoring phase that monitors the main supply voltage and a second monitoring phase that monitors the battery voltage; and
changing the gain of the capacitor divider circuit to a third gain value to monitor the main supply voltage during the first monitoring phase of the active mode.

17. An electronic system comprising:
a switching power converter circuit; and
a power management unit operatively coupled to the switching power converter circuit and including:
a controller configured to control operation of the switching power converter circuit in a low power mode and an active mode;
an oscillator circuit configured to generate clock signals provided to the controller in the low power mode and to control the operation of the switching power converter circuit in the low power mode; and
a comparator circuit configured to:
receive a regulated output voltage from the switching power converter circuit;
compare the regulated output voltage to a specified voltage threshold; and
generate a signal to turn off the oscillator circuit when the regulated output voltage is greater than the specified threshold voltage and turn on the oscillator circuit when the regulated output voltage is less than the specified threshold voltage.

18. The electronic system of claim 17,
wherein the switching power converter circuit includes a capacitor and the comparator circuit is configured to receive the regulated output voltage from the capacitor as a circuit supply voltage; and
wherein comparator circuit is further configured as an only circuit element of the power management unit enabled during the low power mode when the regulated output voltage is greater than the specified threshold voltage.

19. The electronic system of claim 17, wherein the controller is configured to:
implement a first monitoring state machine during a first monitoring phase of the low power mode to monitor the output voltage of the switching power converter circuit; and
implement a second monitoring state machine during a second monitoring phase of the low power mode to monitor a battery voltage.

20. The electronic system of claim 19, including:
a capacitive divider circuit operatively coupled to the controller and configured to implement a first plurality of selectable gain values and a second plurality of selectable gain values; and
wherein the controller is configured to change a gain of the capacitive divider circuit to a first gain value of the first plurality of selectable gains values during the first monitoring phase and to a second gain value of the second plurality of selectable gain values during the second monitoring phase.

21. The electronic system of claim 19, wherein the controller is configured to implement a power converter state machine to control the switching power converter circuit to generate the output voltage compared to the specified voltage threshold when in the low power mode and to generate a main supply voltage when in the active mode.

22. The electronic system of claim 19, wherein the switching power converter circuit is a direct current (DC) to DC converter circuit and the controller is configured to set a gain of the switching power converter circuit according to the battery voltage.

* * * * *

UNITED STATES PATENT AND TRADEMARK OFFICE
CERTIFICATE OF CORRECTION

PATENT NO. : 10,671,111 B1
APPLICATION NO. : 16/224407
DATED : June 2, 2020
INVENTOR(S) : Spaggiari et al.

It is certified that error appears in the above-identified patent and that said Letters Patent is hereby corrected as shown below:

On the Title Page

Item [65], Column 1, Line 1, after "2018", insert --¶(65) Prior Publication Data
US 2020/0192416 A1 Jun. 18, 2020--

In the Claims

Column 16, Line 60, Claim 10, delete "mode:" and insert --mode;-- therefor

Signed and Sealed this
First Day of December, 2020

Andrei Iancu
*Director of the United States Patent and Trademark Office*